United States Patent
Kim et al.

(10) Patent No.: US 7,535,282 B2
(45) Date of Patent: May 19, 2009

(54) DYNAMIC WELL BIAS CONTROLLED BY VT DETECTOR

(75) Inventors: Tae Kim, Boise, ID (US); Howard Kirsch, Eagle, ID (US); Charles Ingalls, Meridian, ID (US); David Pinney, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 167 days.

(21) Appl. No.: 11/146,852

(22) Filed: Jun. 7, 2005

(65) Prior Publication Data

US 2006/0273842 A1     Dec. 7, 2006

(51) Int. Cl.
- H03K 19/017 (2006.01)
- G05F 1/575 (2006.01)
- H01L 27/04 (2006.01)

(52) U.S. Cl. .................. 327/537; 327/376; 327/434; 327/541

(58) Field of Classification Search .................. None
See application file for complete search history.

(56) References Cited

U.S. PATENT DOCUMENTS

| | | | | |
|---|---|---|---|---|
| 5,757,702 A | * | 5/1998 | Iwata et al. | 365/189.05 |
| 5,874,851 A | * | 2/1999 | Shiota | 327/537 |
| 5,892,260 A | * | 4/1999 | Okumura et al. | 257/347 |
| 5,917,365 A | * | 6/1999 | Houston | 327/534 |
| 6,429,684 B1 | * | 8/2002 | Houston | 326/83 |
| 6,621,327 B2 | * | 9/2003 | Kitamoto | 327/537 |
| 6,833,750 B2 | * | 12/2004 | Miyazaki et al. | 327/534 |

OTHER PUBLICATIONS

K. Hardee et al., "A 0.6V 205MHz 19.5ns IRC 16Mb Embedded DRAM," 2004 International Solid State Circuits Conference, § 11.1 at 200-201 (Feb. 17, 2004).
S. Narendra et al., "Ultra-Low Voltage Circuits and Processor in 180nm to 90nm Technologies with a Swapped-Body Biasing Technique," 2004 International Solid State Circuits Conference, § 8.4 at 156-157 (Feb. 17, 2004).

\* cited by examiner

*Primary Examiner*—Donovan Lincoln
*Assistant Examiner*—Terry L Englund
(74) *Attorney, Agent, or Firm*—Wong Cabello Lutsch, Rutherford & Brucculeri, LLP

(57) ABSTRACT

The p- well back bias for NCH transistors in a DRAM sense amplifier circuit is dynamically adjusted. Preferably, during sensing, the p- well back bias for the NCH transistors of the sense amp is increased to in effect lower the threshold voltages for the NCH transistors so that they are more easily activated during sensing. The back bias voltage is preferably increased from ground (its normal value) to the threshold voltage of a NCH transistor (NVt), a value low enough to prevent the circuit from latch-up. Moreover, this voltage is preferably arrived at using a Vt detector/bias circuitry which receives the p- well bias voltage as feedback. While benefiting the disclosed sense amp circuit, the dynamic bias provided to the p- well of the NCH transistors can also benefit NCH transistors in other CMOS circuitry as well. Moreover, similar modifications to dynamically bias the n- wells of PCH transistors in CMOS circuits are also provided to increase the sensing margins of PCH transistors as well.

38 Claims, 4 Drawing Sheets

DYNAMIC WELL BIAS CONTROLLED BY VT DETECTOR

FIELD OF THE INVENTION

Embodiments of this invention relate to integrated circuits, and particularly to sense amplifier or other CMOS circuits with improved margins at lower voltages.

BACKGROUND

As integrated circuit technology progresses, the feature sizes of the circuitry and the voltages used to stimulate them continue to decline. As voltages decrease, it becomes more difficult to sense particular voltages. Consider for example the sense amplifier (sense amp) 30 of FIG. 1. Such a sense amp is traditionally used in Dynamic Random Access Memories (DRAMs) 10 and is typical in design, comprising cross-coupled P-channel (PCH) and N-channel (NCH) transistors in a flip-flop configuration to detect data on at least one column (Digit or Digit*) in a memory array.

As operating voltages are lowered, it can become more difficult for the sense amp 30 to properly function. In particular, the inventors have noticed that the N-channel (NCH) transistors in the sense amp 30 may not turn on (or may not turn on enough) when desired because the sensed voltages are relatively small compared to the threshold voltage of the NCH transistors (NVt). It is desired to remedy this problem, and more generally to provide a solution to reduced sensing margins caused by lower operating voltages in other non-sense-amp contexts as well, such as in general Complementary Metal Oxide Semiconductor (CMOS) circuitry.

SUMMARY

In one embodiment of the invention, the p- well back bias for the NCH transistors in a DRAM sense amplifier circuit are dynamically adjusted. Preferably, during sensing, the p- well back bias for the NCH transistors of the sense amps is increased to in effect lower the threshold voltages for the NCH transistors so that they are more easily activated during sensing. The back bias voltage is preferably increased from ground (its normal value) to the threshold voltage of a NCH transistor (NVt), a value low enough to prevent the circuit from latch-up. Moreover, this voltage is preferably arrived at using a Vt detector/bias circuitry which receives the p- well bias voltage as feedback. While benefiting the disclosed sense amp circuit, the dynamic bias provided to the p- well of the NCH transistors can also benefit NCH transistors in other CMOS circuitry as well. Moreover, similar modifications to dynamically bias the n- wells of PCH transistors in CMOS circuits are also provided to increase the sensing margins of PCH transistors as well.

BRIEF DESCRIPTION OF THE DRAWINGS

Embodiments of the inventive aspects of this disclosure will be best understood with reference to the following detailed description, when read in conjunction with the accompanying drawings, in which.

DETAILED DESCRIPTION

Figure 1:
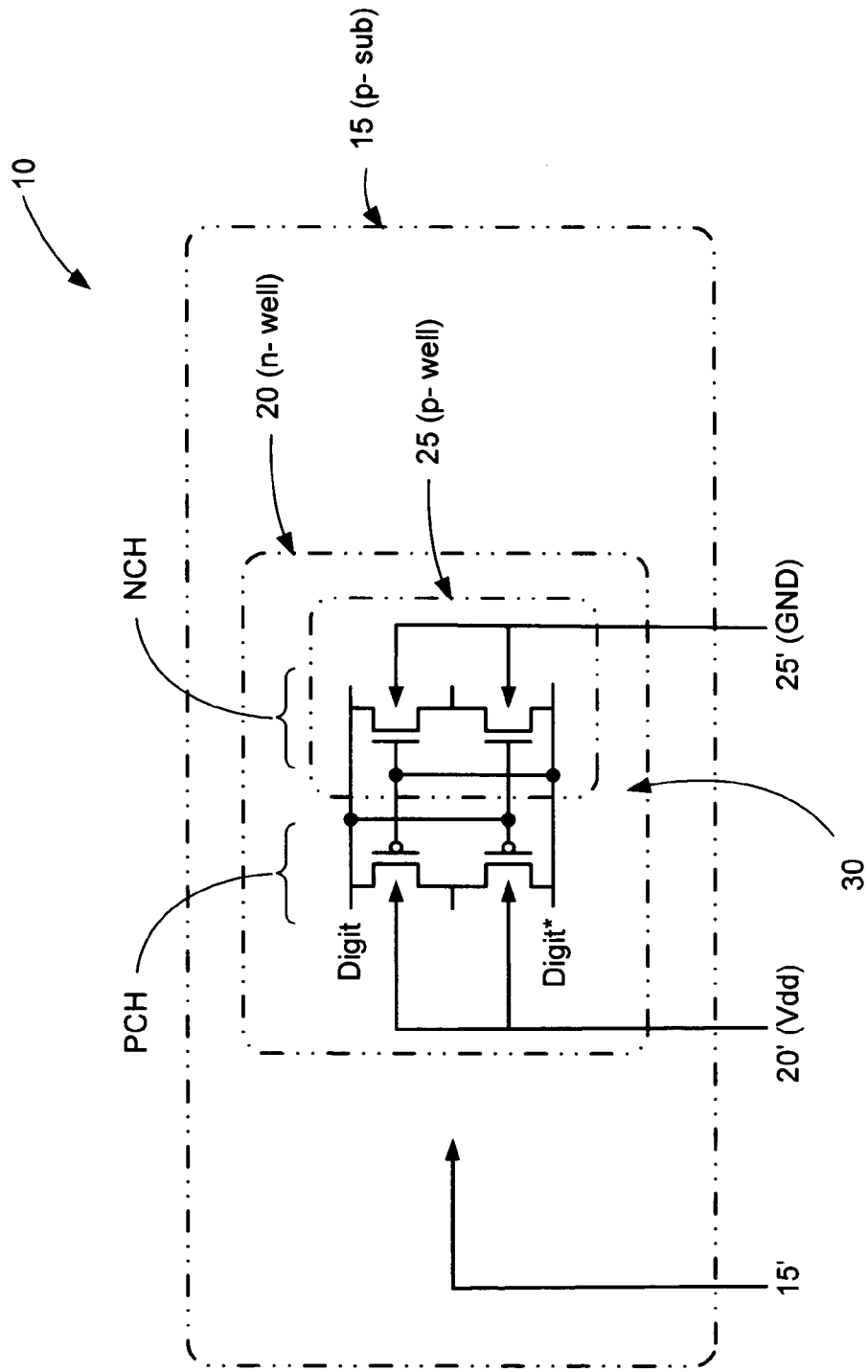
FIG. 1 illustrates a prior art sense amp and its associated wells in a DRAM integrated circuit.

Referring again briefly to FIG. 1, note that the sense amp circuit 30 ("operative circuit") is a CMOS circuit, i.e., it has both N-channel (NCH) and P-channel (PCH) transistors. Because of the differing polarities of these two types of transistors, each type will sit within a "well" (or wells) formed in the bulk substrate 15. Thus, as is typical, the PCH transistors sit in a well (or wells) 20, and the NCH transistors sit in a well (or wells) 25 within well 20. Because the bulk substrate is usually p- doped, well 20 will be counterdoped (n- doped) and well 25 within it will be again counterdoped (p- doped). In a CMOS circuit, like the exemplary sense amp 30, the n- wells 20 are tied to power (i.e., Vdd, the chip's internal operating voltage) by a well contact (or contacts) 20', while the p- wells 25 are generally tied to ground (i.e., GND, or 0 Volts) by a well contact (or contacts) 25'. The bulk substrate 15 is typically grounded by its own contact (or contacts) 15', although the bulk substrate can also take on different bias levels (e.g., negative voltages, as is common in DRAM technologies).

Figure 2:
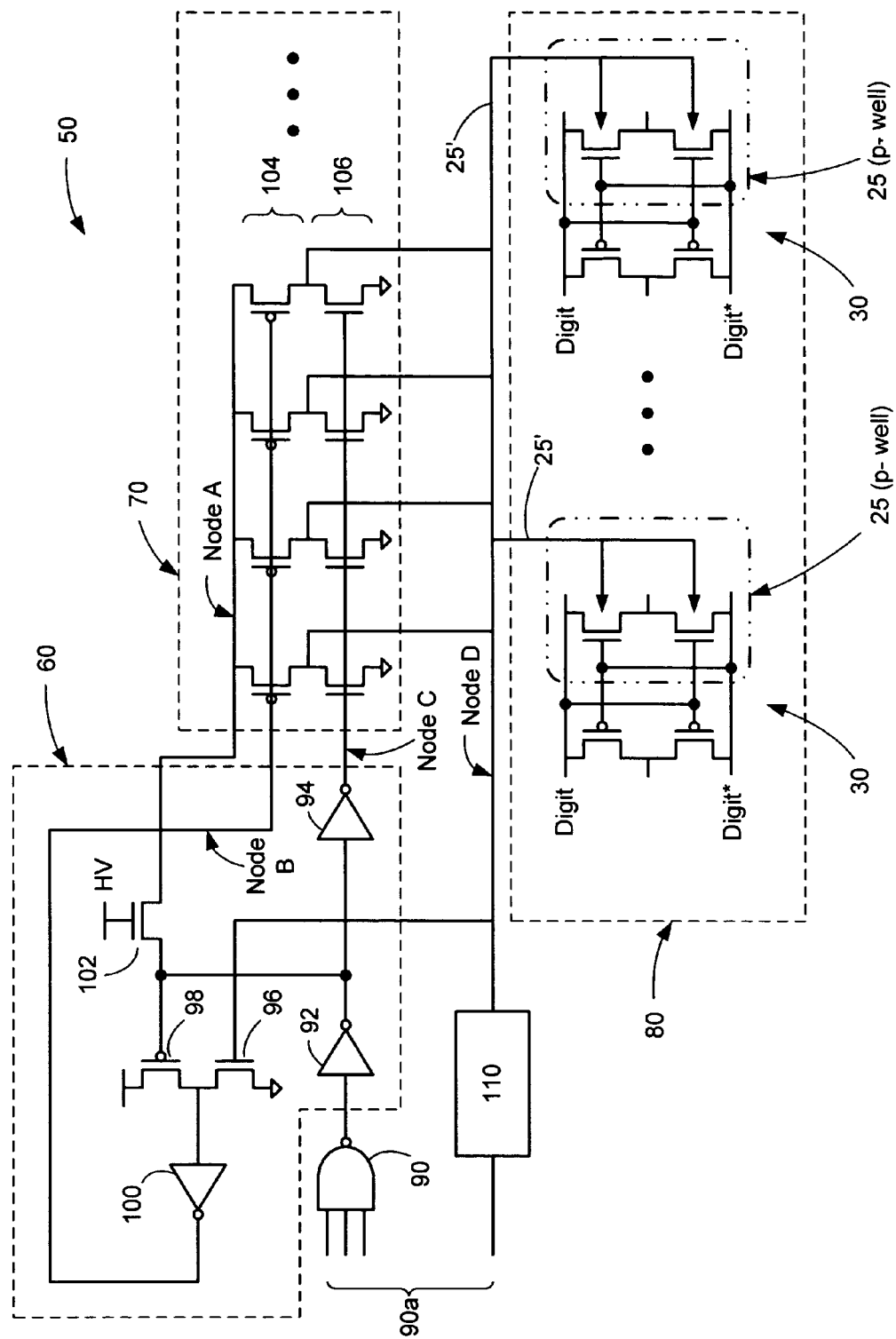
FIG. 2 illustrates circuitry for dynamically biasing the p-well of the NCH transistors in the sense amp during sensing.

Referring now to FIG. 2, a solution to the problem introduced earlier—reduced sensing margin of the NCH transistors at lower operating voltages—comprises dynamically biasing the p- wells 25 of the sense amp circuits 30 to a higher voltage. By so doing, the threshold voltage of the NCH transistors (i.e., NVt) is effectively reduced, making it easier to turn on these transistors, and hence accurately/quickly sense the voltages coming from the DRAM array on complementary column signals Digit and Digit*.

As just noted, the preferred embodiment of the disclosed technique is dynamic. This dynamic nature comprises two aspects. First, adjusting the p- wells 25 of the sense amps 30 occurs only during certain times in the operation of the chip, i.e., while sensing. During other times (e.g., when the cells are being precharged), the p- wells 25 are biased to normal values, i.e., ground. Selective activation of the p- well bias is preferred to reduce stand-by current during those times when well bias is not needed (i.e., non-sensing periods). However, if preferred and if standby current is not an issue, the p- wells 25 can be biased at all times and never grounded as in traditional p- wells. The second aspect comprises the voltage to which the p- wells are biased during sensing. As will be seen, the bias provided to the p- wells 25 is not a set voltage, but rather comprises a voltage that is detected and fed back so that it can be adjusted in real time. As will be seen, the use of feedback helps to ensure that the bias voltage provided to the p- wells 25 is not too high, and otherwise ensures a bias voltage appropriate for the processing, temperature, and voltage environment in question, which can be variable.

FIG. 2 shows one embodiment for p- well bias circuitry 50 which will operate as just explained. The circuitry 50 comprises a bank of sense amps 30 (80), i.e., the circuits whose p-well 25 biases are to be dynamically adjusted, a bias circuit 70, and a Vt detector circuit 60. (All circuitry beside the bank of sense amps 80 whose wells are being biased may be referred to generically as a "driver circuit"). Also shown is a logic gate 90 which informs the circuit 50 via a control signal or signals 90a when the circuit should be operative to provide an increased bias level to the p- wells 25. (The logic gate 90 here is shown as a NAND gate, but could comprise different logic, or could simply comprise a bias-enable/no-bias-enable signal. In short, NAND gate 90 is merely exemplary of the logic that selectively controls circuitry 50). During those periods when no bias is to be provided (e.g., during pre-charge), a "normal" ground bias is provided to the p- wells 25 via p- well contacts 25' (i.e., Node D).

Before explaining the operation of the p- well bias circuitry 50, note that the stages in bias circuit 70 (four of which are shown) are connected in parallel. Because of this, one skilled in the art will recognize that these stages could be combined together into one large stage. However, because the bank of sense amps 80 are distributed along the edge of an array of cells, the biasing stages in bias circuit 70 are preferably similarly distributed to ensure even power distribution to the various sense amps 30. Preferably one such stage in bias circuit 70 will provide the p- well 25 bias voltage to some fixed number of sense amps (e.g., 16, 32, 64, 128, etc.).

Prior to sensing, the output of logic 90 is high, which renders the output of inverter 92 low, and the output of inverter 94 (Node C) high. Because the output of inverter 92 is low, Node A is also brought low through pass gate 102, whose gate is high and therefore is always on. (Note that pass gate 102, while not strictly necessary, is useful to preventing latch up). Additionally, the output of inverter 92 being low turns on PCH transistor 98, which inputs a high to inverter 100, which in turn outputs a low on Node B. Node B being low turns on PCH transistors 104, which couples Node A (low) to Node D. Node D is additionally coupled to a low state by Node C, which is high and therefore turns on transistors 106. In any event, Node D, which is coupled to the contacts 25' for the p- wells 25, is at ground during periods when no sensing is taking place.

When sensing is to begin, and a non-ground p- well bias is to be provided to the p- wells 25, the output of logic 90 is brought low, which renders the output of inverter 92 high, and the output of inverter 94 (Node C) low. By bringing Node C low, NCH transistors 106 are off, and the p- well contacts 25' are decoupled from ground. Because the output of inverter 92 is high, Node A also goes high as passed through the pass gate 102. With the bias circuit 70 now powered by Node A being high, the output of the bias circuit, Node D, will tend to increase, a point which is especially true when it is remembered that PCH transistors 104 were on prior to sensing.

As Node D increases, eventually NCH transistor 96 (which was off prior to sensing) will start to turn on when the potential at Node D approaches NVt. Additionally, PCH transistor 98 is now off by virtue of the output of inverter 92 being high. As a result, the input to inverter 100 is brought relatively low, and the output of inverter 100 (Node B) is brought relatively high. When Node B is brought relatively high, transistors 104 staff to turn off and Nodes A and D staff to decouple, preventing Node D from further increasing. Thus, the circuit reaches a steady state via the described feedback mechanism such that Node D is encouraged to remain at the switching point between NCH transistor 96 being on and off i.e., at NVt. Understanding the maintenance of this switching point is facilitated when it is realized that certain devices in the circuitry, particularly transistor 96, inverter 100, and PCH transistors 104, are not operating at absolute high or low (i.e., power or ground) levels. Consider for example when Node D equals NVt. At this condition, transistor 96, which receives Node D, is only weakly on, as already alluded to. As a result, the input to inverter 100 is weakly low (i.e., at a voltage level somewhat higher than ground), and its output (Node B) is in turn weakly high (i.e., at a voltage level somewhat lower than power). This causes PCH transistors 104 in turn to be only weakly off, such that Nodes A and D are only weakly (but not completely) decoupled. Fluctuations at in the voltage at Node D will affect the relatively strength of devices 96, 100, and 104 to maintain the equilibrium of Node D at NVt. For example, if Node D goes above NVt, transistor 96 is turned more strongly on than it would be during equilibrium. The input to inverter 100 is thus brought more strongly toward ground, and the output of inverter 100 (Node B) in turn brought more strongly toward power. This slightly higher voltage at Node B forces transistors 104 off to a greater degree, such that Node D is more strongly decoupled from power at Node A, which would cause the voltage at Node D to fall. However, if Node D goes below NVt, transistor 96 is turned on more weakly than it would be during equilibrium. The input to inverter 100 is thus not at as strong of a low level, and the output of inverter 100 (Node B) in turn drops even further in voltage away from a full power condition power. This relative decrease in Node B turn transistors 104 on to a greater degree, such that node D is more strongly (but not completely) coupled to power at Node A, which would cause the voltage at Node D to increase. When these competing tendencies of Node D being too high (i.e., above NVt) or too low (i.e., below NVt) are appreciated, the steady state effect is that Node D is held at NVt (e.g., 0.5 to 0.6 Volts). Because Node D is coupled to the p- well contacts 25', the p- wells 25 are thus biased to NVt. As noted earlier, this increased back bias to the p- wells effectively reduces the threshold voltages of the NCH transistors in the sense amp, so that they are easier to turn on.

By biasing the p- wells 25 to NVt, the p- wells are intelligently biased not to a fixed value, but to a value which like other aspects of the integrated circuit will vary with process, voltages, and temperatures. Thus, the disclosed approach, with its reliance on feedback, is preferable to the provision of otherwise set voltages to the p- wells 25. This is important, because the circuit 50 may not behave properly if the p- wells 25 are not biased to the proper level, and particularly will not behave properly if biased too high. For example, note that an NCH transistor (such as those used in sense amp 30) will often have an n+ source or drain region coupled to a ground signal. If the p- well 25 bias is too high, the diode formed by the p- well 25 and the n+ source or drain region may become forward biased, draining current and increasing the risk of latch-up. By ensuring that the p- wells 25 are kept no higher than NVt, and controlling the same to be less than a diode Vt, proper circuit performance can be assured, even given process, voltage and temperature variations. However, a set voltage, not tailored by feedback, could also be used to bias the p- wells 25 in other useful (although non-preferred) embodiments.

Of course, use of the disclosed Vt detection circuit 60, biasing circuit 70, and the manners in which they are interconnected to provide controlled feedback of the p- well bias voltage, are merely exemplary. Other circuits and circuit arrangements are possible to achieve the same results. For example, circuit 110, as well as providing a ground to the p- wells 25 when the sense amps 30 are not sensing, could also include a clamp circuit to prevent the p- well bias from growing too high in value.

Further unexpectedly beneficial results flow from the reduction of the NCH threshold voltages in a DRAM sense amp 30 that are worthy of note. The sense amp 30 preferably is able to discern small differences in the voltages appearing on Digit and Digit*. (See FIG. 1). The voltage difference that can be accurately discerned is governed in part by threshold differences in the NCH transistors used in the sense amp 30. Ideally, such threshold differences should be zero, but in reality, due to processing conditions, they will be different. Thus, it might be the case, without threshold voltage adjustment of the sort disclosed herein, that the threshold voltages of the two NCH transistors in the sense amp 30 would be 0.6 and 0.5 Volts—a 0.1 Volt difference. This essentially sets the resolution of the sense amp 30, which would be unable to reliably sense a difference on Digit and Digit* that is less than or equal to 0.1 Volt. However, when NCH threshold voltage adjustment via biasing of the p- wells 25 is employed as discussed herein, these same NCH transistors might exhibit, for example, threshold voltages of 0.3 and 0.25 Volts. Thus, what initially was a 0.1 Volt difference between the thresholds becomes a 0.05 Volt difference when the p- well 25 is biased. This improves the performance of the sense amp 30, which can now accurately determine differences in Digit and Digit* as low as 0.05 Volts. In short, through use of the disclosed technique, the sensitivity of the sense amp 30 is increased. Moreover, because this sensitivity corresponds to refresh performance, refreshing of the DRAM can occur less frequently. For example, it is estimated that refresh performance through use of the disclosed technique could improve by 50%. As the time and logistics of refresh are significant in a DRAM, refresh improvement constitutes another unexpected benefit of use of the disclosed technique.

Figure 3:
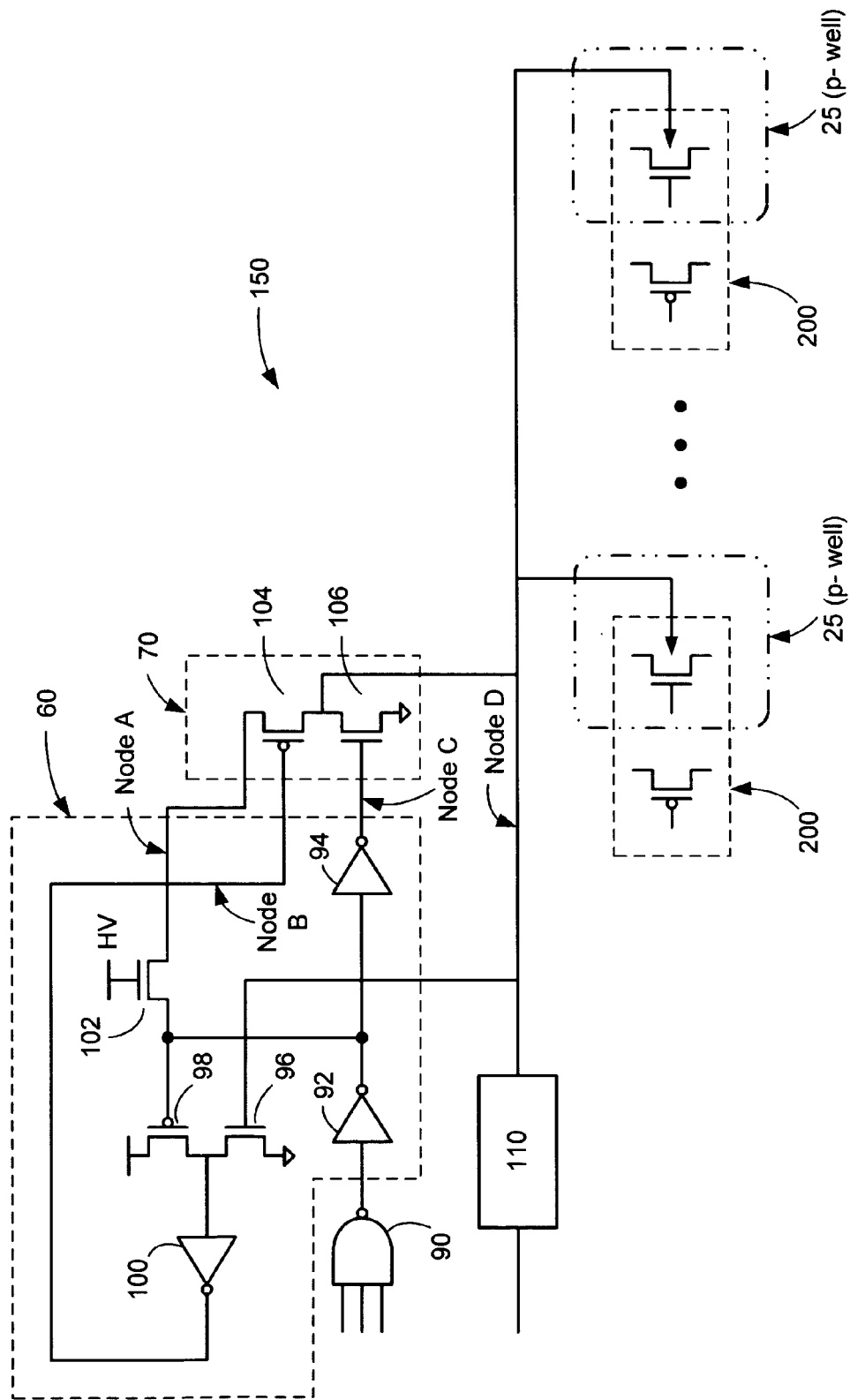
FIG. 3 illustrates use of the circuitry of FIG. 2 to similarly dynamically bias the p- wells of NCH transistors in a generic CMOS circuit.

To this point, the solution to the problem of NCH operation at low operating voltages has centered on the sense amps of DRAM devices. Such circuits are good candidates to benefit from the disclosed technique, because they are particularly voltage and timing sensitive. However, other operative CMOS circuits can also benefit from this technique. For example, as shown in FIG. 3, a general CMOS circuit 200 is shown. The CMOS circuit 200, like the sense amp 30, comprises NCH and PCH transistors. One skilled in the art will realize that such NCH and PCH transistors can in a CMOS circuit be connected to form a variety of structures (gates, inverters, latches), and are only shown by single exemplary NCH and PCH transistors in FIG. 3 for simplicity. Should the CMOS circuit 200 suffer from the same problem as the sense amp—low operating voltages not adequately turning on the NCHs—the p- wells 25 for the CMOS circuits 200 can be biased using the same circuitry and techniques discussed with respect to the sense amps 30 of FIG. 2.

Figure 4:
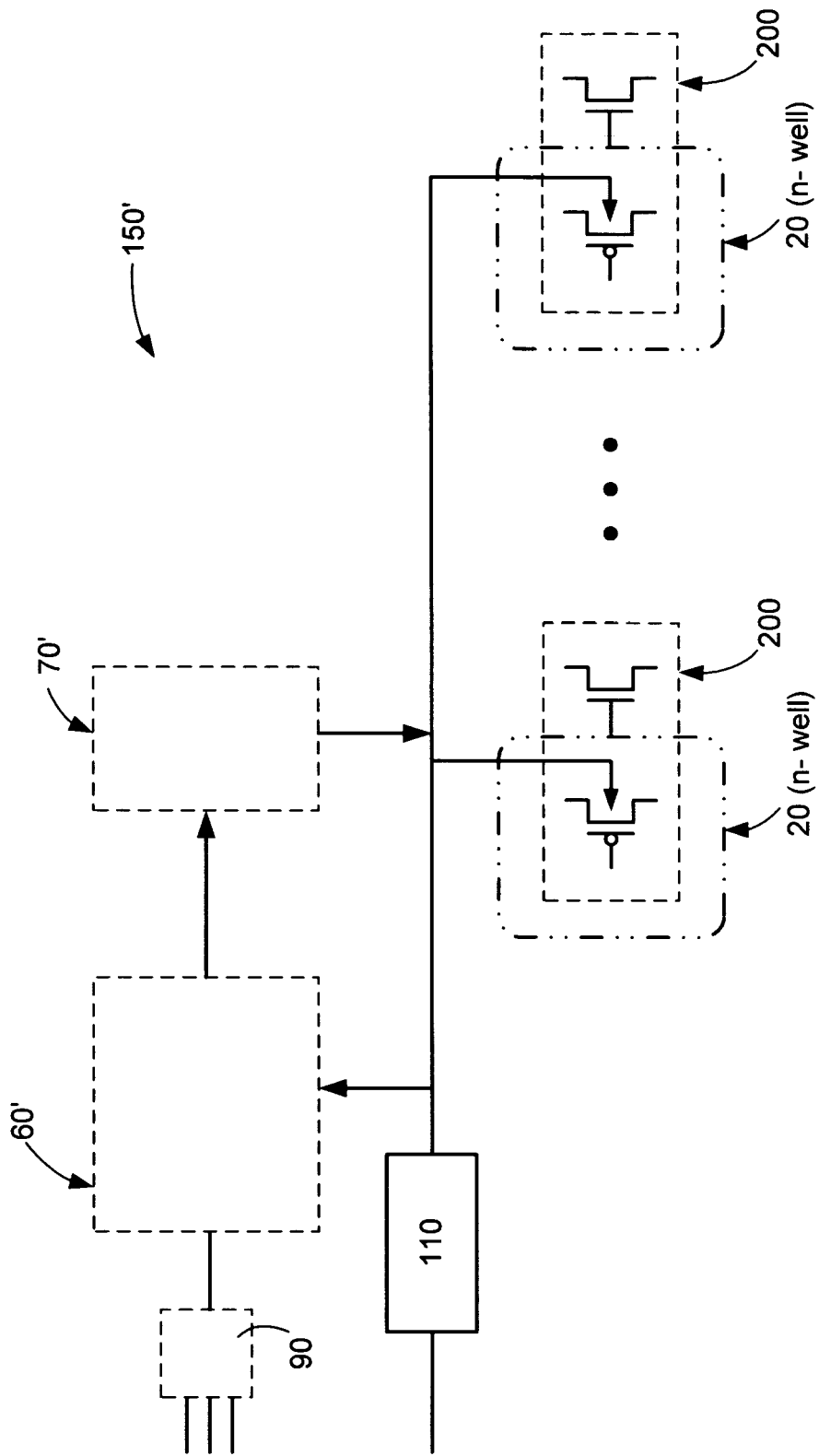
FIG. 4 illustrates use of the circuitry of FIG. 2 to similarly dynamically bias the n- wells of PCH transistors in a generic CMOS circuit.

Moreover, the disclosed techniques are adaptable to adjust the bias of n- wells 20, and hence to adjustment the threshold voltages of PCH transistors (PVt). This is illustrated schematically in FIG. 4. Of course, because PCH are of a different polarity, and because the n- wells 20 in CMOS circuits are generally biased to Vdd, the Vt detection circuitry 60' and bias circuitry 70' would need to be modified accordingly. But such modification is easily within the ambit of one skilled in the art. In any event, because the problem of NVt adjustment is more prominent than PVt, exemplary circuitry used to perform N- well 20 bias voltage adjustment is not specifically disclosed.

In short, it should be understood that the inventive concepts disclosed herein are capable of many modifications. To the extent such modifications fall within the scope of the appended claims and their equivalents, they are intended to be covered by this patent.

What is claimed is:

1. An integrated circuit, comprising:
   a sense amplifier at the edge of an array of memory cells, the sense amplifier coupled to a pair of complementary data lines coupled to certain of the memory cells, the sense amplifier comprising at least one transistor of a first polarity in a well, wherein the sense amplifier senses data on a data line during a first time period and does not sense data during a second time period;
   a driver circuit for biasing the well to a first voltage during the first time period, and for biasing the well to a second voltage during the second time period, wherein the first voltage differs from the second voltage by a transistor threshold voltage.

2. The integrated circuit of claim 1, wherein the driver circuit receives the first voltage as feedback to maintain the first voltage to an appropriate level.

3. The integrated circuit of claim 1, wherein the at least one transistor is an N-channel transistor, and the well is a p well.

4. The integrated circuit of claim 1, wherein the first voltage is a threshold voltage of an N-channel transistor, and the second voltage is ground.

5. The integrated circuit of claim 1, wherein biasing the well to the first voltage makes the at least one transistor easier to turn on than when the well is biased to the second voltage.

6. The integrated circuit of claim 1, wherein the well is a p well inside an n well.

7. The integrated circuit of claim 6, wherein the n well is biased to an internal power source voltage for the integrated circuit, the first voltage is a threshold voltage of an N-channel transistor, and the second voltage is ground.

8. An integrated circuit, comprising:
   an operative circuit comprising at least one transistor of a first polarity in a well,
   a driver circuit for selectively biasing the well to a voltage during certain time periods during the operation of the operative circuit, wherein the driver circuit receives the voltage as feedback to maintain the voltage at an appropriate level, wherein the voltage comprises a transistor threshold voltage.

9. The integrated circuit of claim 8, wherein the operative circuit is a sense amplifier, and wherein during the certain time periods the sense amplifier is sensing data along a column in a memory array.

10. The integrated circuit of claim 8, wherein the at least one transistor is an N-channel transistor, and the well is a p well.

11. The integrated circuit of claim 8, wherein biasing the well to the voltage makes the at least one transistor easier to turn on than when the well is not biased.

12. The integrated circuit of claim 8, wherein the driver circuit further biases the well to ground not during the certain time periods.

13. The integrated circuit of claim 8, wherein the well is a p well inside an n well.

14. The integrated circuit of claim 13, wherein the n well is biased to an internal power source voltage for the integrated circuit, and the voltage is a threshold voltage of an N-channel transistor.

15. A CMOS circuit, comprising:
   an n well comprising at least one P-channel transistor and a p well within the n well comprising at least one N-channel transistor,
   wherein the p well is biased to ground during first periods of operation of the CMOS circuit, and to a transistor threshold voltage during second periods of the CMOS circuit, and
   wherein the transistor threshold voltage is produced by a driver circuit in which the p well bias is fed back to maintain the transistor threshold voltage at an appropriate level.

16. The CMOS circuit of claim 15, wherein the at least one P-channel and at least one N-channel transistors comprise portions of a sense amplifier, and wherein the second periods of operation comprise sensing of data along a column in a memory array.

17. The CMOS circuit of claim 15, wherein the transistor threshold voltage is a threshold voltage of an N-channel transistor.

18. The CMOS circuit of claim 15, wherein the n well is biased to an internal power source voltage for the CMOS circuit.

19. A CMOS circuit, comprising:
N-channel transistors in a p well, wherein the p well is dynamically biased by feedback to a transistor threshold voltage.

20. The CMOS circuit of claim 19, wherein the p well is only dynamically biased during a first time period.

21. The CMOS circuit of claim 20, wherein the p well is biased to ground outside of the first time period.

22. The CMOS circuit of claim 20, wherein the CMOS circuit is a sense amplifier, and wherein the sense amplifier is operational when sensing data along a column in a memory array.

23. The CMOS circuit of claim 19, wherein the transistor threshold voltage is a threshold voltage of an N-channel transistor.

24. The CMOS circuit of claim 19, further comprising P-channel transistors in an n well, wherein the p well is within the n well, and wherein the n well is biased to an internal power source voltage for the CMOS circuit.

25. A sense amplifier, comprising:
P-channel transistors in an n well and N-channel transistors in a p well within the n well, wherein the P-channel and N-channel transistors are cross-coupled to detect data on at least one column in a memory array,
wherein the p well is biased to an N-channel transistor threshold voltage at least when the sense amplifier is sensing.

26. The sense amplifier of claim 25, wherein the p well is biased to the N-channel transistor threshold voltage only when the sense amplifier is sensing, and is otherwise biased to ground.

27. The sense amplifier of claim 25, wherein biasing the p well to the N-channel transistor threshold voltage comprises use of a detector feedback circuit for receiving the N-channel transistor threshold voltage and adjusting the N-channel transistor threshold voltage to an appropriate level.

28. The sense amplifier of claim 25, wherein the n well is biased to a power source voltage.

29. A method for biasing a well in a sense amplifier at the edge of an array of memory cells, the sense amplifier coupled to at least one column coupled to certain of the memory cells, the well comprising at least one transistor of a first polarity, the method comprising:
biasing the well to a first voltage during a first time period when the sense amplifier is sensing data from the at least one column, and
biasing the well to a second voltage during a second time period corresponding to a precharge time period during which the sense amplifier is not sensing, wherein the first voltage differs from the second voltage by a transistor threshold voltage.

30. The method of claim 29, wherein biasing the well to the first voltage comprises feeding the first voltage back to a detector circuit to maintain the first voltage at an appropriate level.

31. The method of claim 29, wherein the at least one transistor is an N-channel transistor, and the well is a p well.

32. The method of claim 29, wherein the first voltage is a threshold voltage of an N-channel transistor, and the second voltage is ground.

33. The method of claim 29, wherein biasing the well to the first voltage makes the at least one transistor easier to turn on than when the well is biased to the second voltage.

34. The method of claim 29, wherein the well is a p well inside an n well.

35. A method for biasing a CMOS circuit, the CMOS circuit comprising an n well comprising at least one P-channel transistor and a p well within the n well comprising at least one N-channel transistor, the method comprising:
biasing the p well to ground during first periods of operation of the CMOS circuit; and
biasing the p well to a transistor threshold voltage during other periods of operation of the CMOS circuit, wherein the transistor threshold voltage is maintained by a feedback circuit.

36. The method of claim 35, wherein the CMOS circuit is a sense amplifier, and wherein the other periods comprise sensing of data along at least one column in a memory array.

37. The method of claim 35, wherein the transistor threshold voltage is a threshold voltage of an N-channel transistor.

38. The method of claim 35, further comprising biasing then well to an internal power source voltage for the CMOS circuit.

* * * * *

UNITED STATES PATENT AND TRADEMARK OFFICE
CERTIFICATE OF CORRECTION

PATENT NO. : 7,535,282 B2 Page 1 of 1
APPLICATION NO. : 11/146852
DATED : May 19, 2009
INVENTOR(S) : Tae Kim et al.

It is certified that error appears in the above-identified patent and that said Letters Patent is hereby corrected as shown below:

In column 8, line 43, in Claim 38, delete "then" and insert -- the n --, therefor.

Signed and Sealed this

Twenty-eighth Day of July, 2009

JOHN DOLL
*Acting Director of the United States Patent and Trademark Office*